US010288659B2

(12) United States Patent
Shah et al.

(10) Patent No.: US 10,288,659 B2
(45) Date of Patent: May 14, 2019

(54) SYSTEM AND METHOD FOR DETERMINING IDENTITY INFORMATION OF AN ELECTRICALLY OPERABLE MACHINE

(71) Applicant: General Electric Company, Schenectady, NY (US)

(72) Inventors: Jigar Jayesh Shah, Houston, TX (US); Matthew Christian Nielsen, Glenville, NY (US); Conner B Shane, Glenville, NY (US); Harry Kirk Mathews, Jr., Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 743 days.

(21) Appl. No.: 14/664,091

(22) Filed: Mar. 20, 2015

(65) Prior Publication Data
US 2016/0274157 A1 Sep. 22, 2016

(51) Int. Cl.
*B60L 11/18* (2006.01)
*H02J 7/04* (2006.01)
(Continued)

(52) U.S. Cl.
CPC .......... *G01R 27/28* (2013.01); *B60L 11/1824* (2013.01); *B60L 11/1825* (2013.01);
(Continued)

(58) Field of Classification Search
CPC .... B60L 11/18; B60L 11/184; B60L 11/1846; B60L 11/1827; H02J 7/00; H02J 7/04;
(Continued)

(56) References Cited

U.S. PATENT DOCUMENTS 8,315,930 B2 11/2012 Littrell
8,417,598 B2 4/2013 Pinkusevich et al.
(Continued)

FOREIGN PATENT DOCUMENTS

EP 2752967 A1 7/2014
WO 9425992 A1 11/1994
(Continued)

OTHER PUBLICATIONS

European Search Report & Opinion issued in connection with corresponding EP Application No. 16161118.1 dated Aug. 12, 2016.
(Continued)

*Primary Examiner* — Neel D Shah
(74) *Attorney, Agent, or Firm* — GE Global Patent Operation; Seema Katragadda

(57) ABSTRACT

A system for determining identity information corresponding to an electrically operable machine is disclosed, where the electrically operable machine receives electricity from a power supply port. The system includes at least one sensor to generate a signal indicative of the electricity being drawn by the electrically operable machine from the power supply port. The system further includes a controller communicatively coupled to the at least one sensor and configured to determine the identity information corresponding to the electrically operable machine based on one or more electrical characteristics of the signal sensed by the at least one sensor. Method and non-transitory computer readable media for determining the identity of the electrically operable vehicle are also disclosed. Moreover, a system for controlling charging of a vehicle that is operated at least partially by the electricity is also disclosed.

14 Claims, 7 Drawing Sheets

(51) Int. Cl.
*H02J 7/14* (2006.01)
*H02J 7/35* (2006.01)
*G01R 21/00* (2006.01)
*G01R 29/26* (2006.01)
*G01R 27/28* (2006.01)
*H02J 3/18* (2006.01)
*H02J 7/00* (2006.01)

(52) U.S. Cl.
CPC ....... *B60L 11/1838* (2013.01); *B60L 11/1846* (2013.01); *B60L 11/1848* (2013.01); *G01R 21/00* (2013.01); *G01R 29/26* (2013.01); *H02J 3/18* (2013.01); *H02J 7/0027* (2013.01); *H02J 2007/0001* (2013.01); *Y02E 40/30* (2013.01); *Y02T 10/7005* (2013.01); *Y02T 10/7055* (2013.01); *Y02T 10/7072* (2013.01); *Y02T 90/121* (2013.01); *Y02T 90/128* (2013.01); *Y02T 90/14* (2013.01); *Y02T 90/16* (2013.01); *Y02T 90/163* (2013.01); *Y02T 90/169* (2013.01); *Y04S 30/14* (2013.01)

(58) Field of Classification Search
CPC .... H02J 7/14; H02J 7/35; G01R 27/28; G01R 21/00; G01R 29/26
USPC ........... 324/66; 320/107, 108, 109, 116, 162
See application file for complete search history.

(56) References Cited

U.S. PATENT DOCUMENTS

| | | | |
|---|---|---|---|
| 8,583,551 B2 | 11/2013 | Littrell et al. | |
| 8,890,475 B1* | 11/2014 | Becker | B60L 11/1827 180/65.29 |
| 2004/0130292 A1* | 7/2004 | Buchanan | B60L 11/1811 320/116 |
| 2010/0228405 A1* | 9/2010 | Morgal | B62H 3/02 701/2 |
| 2010/0274656 A1 | 10/2010 | Genschel et al. | |
| 2011/0175569 A1* | 7/2011 | Austin | B60L 11/1824 320/109 |
| 2011/0191265 A1 | 8/2011 | Lowenthal et al. | |
| 2011/0254505 A1 | 10/2011 | Evander et al. | |
| 2012/0161699 A1* | 6/2012 | Chiang | H02J 7/0004 320/109 |
| 2012/0235646 A1* | 9/2012 | Lo | H02J 7/0013 320/137 |
| 2012/0280649 A1* | 11/2012 | Jung | H02J 5/005 320/108 |
| 2012/0280653 A1* | 11/2012 | Prosser | B60L 11/1816 320/109 |
| 2012/0330494 A1 | 12/2012 | Hendrix et al. | |
| 2013/0015815 A1* | 1/2013 | Bianco | B60L 11/1824 320/109 |
| 2013/0328525 A1* | 12/2013 | Erger | H02J 7/00 320/109 |
| 2014/0028254 A1* | 1/2014 | Shane | H02J 3/14 320/109 |
| 2014/0159659 A1* | 6/2014 | Nosaka | B60L 11/1846 320/109 |
| 2014/0176051 A1* | 6/2014 | Hayashi | H02J 3/32 320/107 |
| 2015/0057825 A1 | 2/2015 | Steele et al. | |
| 2016/0101704 A1* | 4/2016 | McCalmont | B60L 11/1809 320/101 |

FOREIGN PATENT DOCUMENTS

| | | |
|---|---|---|
| WO | 2013024483 A2 | 2/2013 |
| WO | 2014075108 A2 | 5/2014 |

OTHER PUBLICATIONS

Shah et al., "Cost-Optimal, Robust Charging of Electrically-Fueled Commercial Vehicle Fleets Via Machine Learning", Systems Conference (SysCon), 2014 8th Annual IEEE, pp. 65-71, 2014, Ottawa, ON, Canada.

Wu et al., "Improving efficiency and reliability of building systems using machine learning and automated online evaluation", Systems, Applications and Technology Conference (LISAT), 2012 IEEE Long Island, May 4-4, 2012, pp. 1-6,Print ISBN:978-1-4577-1342-2.

* cited by examiner

| Vehicle ID | Make / Manufacturer | Model number | Machine number | Maximum power drawn | Energy storage capacity (Ampere hour) | Total harmonic distortion | Harmonics present | Owner / Driver |
|---|---|---|---|---|---|---|---|---|
| Vehicle-A | V | 12345 | 63346 | 3.4 kW | 15 | 0.50% | 2 | John |
| Vehicle-B | W | 14545 | 63156 | 6.25 kW | 10 | 4.50% | 4 | Mike |
| Vehicle-C | X | 16745 | 89167 | 3.45 kW | 12 | 3% | 3 | Charlie |
| Vehicle-D | Y | 12675 | 86990 | 4.4 kW | 20 | 9.96% | 7 | Mathew |
| Vehicle-E | Z | 15445 | 90668 | 2 kW | 10 | 2.82% | 3 | Prince |

FIG. 6

SYSTEM AND METHOD FOR DETERMINING IDENTITY INFORMATION OF AN ELECTRICALLY OPERABLE MACHINE

BACKGROUND

Embodiments of the present disclosure relate to determination of identity information of electrically operable machines (EOMs), and more particularly to systems and methods for selectively adjusting a delivery of electricity to the EOMs.

Traditionally, in order to identify EOMs, such as electric vehicles, hybrid electric vehicles, household electric equipment, or industrial equipment, and the like, use of various marking techniques and associated electronic reading/detection systems have been prevalent. For example, the marking techniques include use of printed names, identity numbers, and/or codes such as barcodes, quick response (QR) codes, and the like. Such printed names, identity numbers, and codes are typically identified by corresponding scanning equipment having optical sensors. Similarly, wireless systems employing radio frequency identifier (RFID) tags have also been employed to determine identity of the EOMs. Such wireless systems require equipping the EOMs and/or owners or drivers/operators of the EOMs with the RFID tags. Moreover, corresponding detection systems also need to be installed at the premises where the EOMs need to be identified.

The abovementioned techniques are prone to human errors. Moreover, such systems require additional infrastructure leading to a costly and spacious system for identification of the EOMs.

BRIEF DESCRIPTION

In accordance with one embodiment, a system for determining identity information corresponding to an electrically operable machine (EOM) is disclosed, where the EOM receives electricity from a power supply port. The system includes at least one sensor to generate a signal indicative of the electricity being drawn by the EOM from the power supply port. The system further includes a controller coupled to the at least one sensor and configured to determine the identity information corresponding to the EOM based on one or more electrical characteristics of the signal sensed by the at least one sensor.

In accordance with one embodiment, a system for controlling charging of a vehicle operable at least partially by electricity is disclosed. The system includes at least one sensor to generate a signal indicative of the electricity being drawn by the vehicle from an electric vehicle supply equipment. The system further includes a controller coupled to the at least one sensor and configured to: determine identity information corresponding to the vehicle based on one or more electrical characteristics of the signal sensed by the at least one sensor; and selectively adjust the charging of the vehicle based on at least one of the identity information corresponding to the vehicle and the one or more electrical characteristics of the signal.

In accordance with one embodiment, a method for determining an identity information corresponding to an EOM is disclosed, where the EOM receives electricity from a power supply port. The method includes receiving a signal indicative of the electricity being drawn by the EOM. The method further includes determining at least one of current and/or voltage characteristics, a power drawn versus time profile, harmonics, or a total harmonic distortion corresponding to the signal. Furthermore, the method includes determining the identity information corresponding to the EOM based on at least one of the current and/or voltage characteristics, the power drawn versus time profile, the harmonics, or the total harmonic distortion.

In accordance with one embodiment, a non-transitory computer readable medium is disclosed. The non-transitory computer readable medium stores an executable code for causing a computer to perform the method of: receiving a signal indicative of a power being drawn by an EOM from a power supply port; determining at least one of current and/or voltage characteristics, a power drawn versus time profile, harmonics, or a total harmonic distortion corresponding to the signal; and determining the identity of the EOM based on at least one of the current and/or voltage characteristics, the power drawn versus time profile, the harmonics, or the total harmonic distortion.

DRAWINGS

These and other features, aspects, and advantages of the present specification will become better understood when the following detailed description is read with reference to the accompanying drawings in which like characters represent like parts throughout the drawings, wherein:

FIG. 6 depicts an example knowledge base developed by a controller, in accordance with one embodiment.

DETAILED DESCRIPTION

The specification may be best understood with reference to the detailed figures and description set forth herein. Various embodiments are described hereinafter with reference to the figures. However, those skilled in the art will readily appreciate that the detailed description given herein with respect to these figures is for explanatory purposes as the method and the system extend beyond the described embodiments.

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances, the modified term may sometimes not be appropriate, capable, or suitable.

Figure 1:
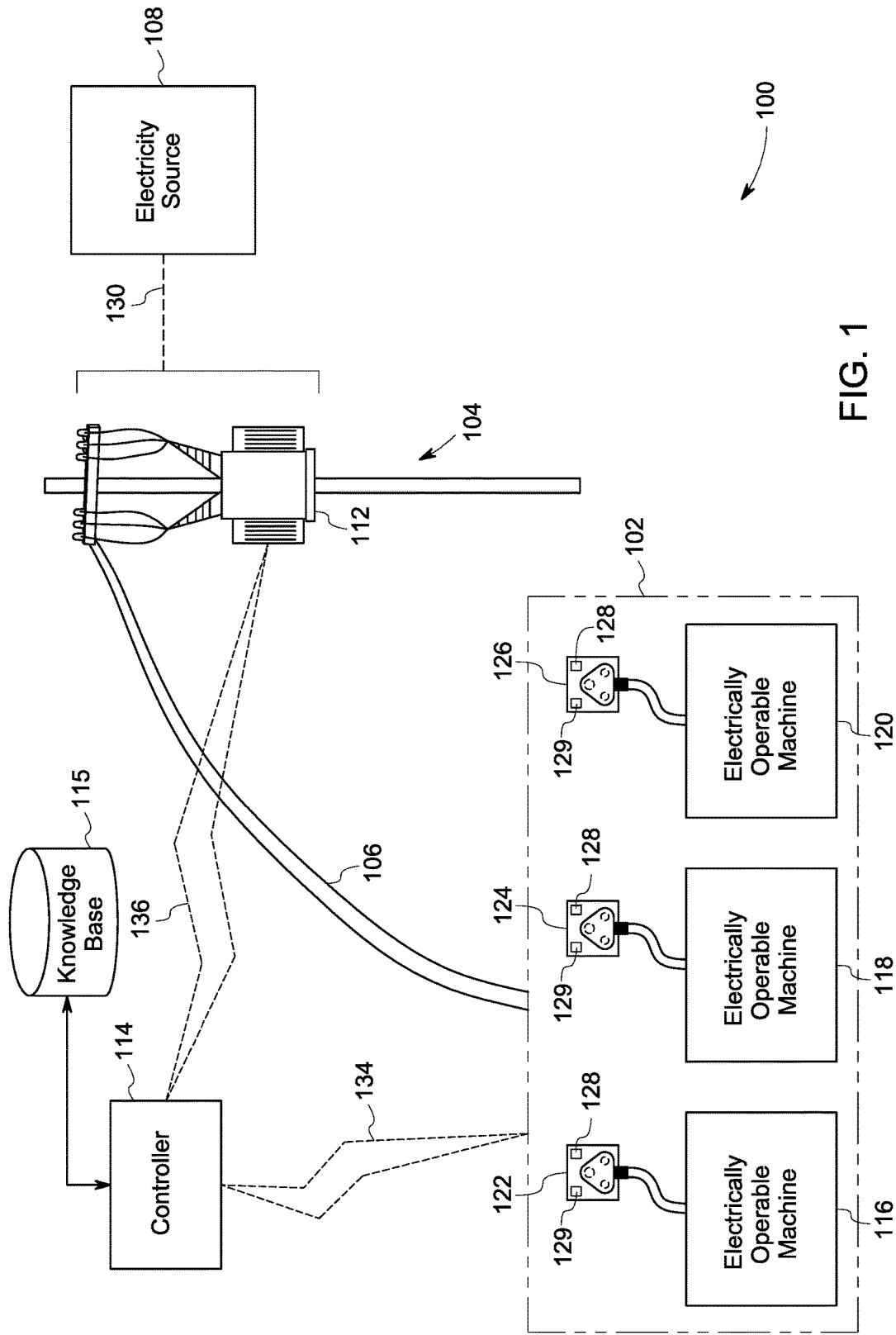
FIG. 1 is a diagrammatical illustration of an infrastructure in which a system for determining identity information corresponding to an electrically operable machine (EOM) may be employed, in accordance with one embodiment.

FIG. 1 is a diagrammatical illustration of an infrastructure 100 in which a system for determining identity information corresponding to an electrically operable machine may be employed, in accordance with one embodiment.

The infrastructure 100 may include a network 102, a pole 104, power supply lines 106 supported by the pole 104 coupled to an electricity source 108, a transformer 112 mounted on the pole 104, and a controller 114. The network 102 may include a plurality of electrically operable machines (EOMs) 116, 118, and 120 that are electrically coupled to power supply ports 122, 124, and 126, respectively, for receiving electricity. Although only three EOMs and three power supply ports have been shown in FIG. 1, one or more EOMs and power supply ports may be present in the network 102 without limiting the scope of the present specification.

In one embodiment, the network 102 may be representative of a residential premise, where the EOMs 116, 118, and 120 may correspond to household electric equipment including, but not limited to, washing machines, dish washers, dryers, microwave ovens, mixers, televisions, and the like. In another embodiment, the network 102 may be representative of a public or an organizational premise such as a vehicle parking and charging facility, where the EOMs 116, 118, and 120 may correspond to a fleet of vehicles (see FIG. 2). Moreover, in yet another embodiment, the network 102 may be representative of an industry, where the EOMs 116, 118, and 120 may correspond to a variety of industrial machines. Each of the EOMs 116, 118, and 120 may include one or more energy storage devices such as batteries and/or capacitors to store at least a portion of the electricity received from the respective power supply ports 122, 124, and 126. The EOMs 116, 118, and 120 may be identified by their respective identity information, for example, a machine make, a machine model, a year of manufacturing, a vehicle number, information associated with the respective energy storage devices, information associated with an owner, operator, or a driver of the EOM, or combinations thereof. The EOMs 116, 118, and 120 may be coupled to the power supply ports 122, 124, and 126, respectively, via a wired or wireless medium. For example, in the embodiment of FIG. 1, a plug and socket type connection may be employed between the EOMs 116, 118, and 120 and the power supply ports 122, 124, and 126.

In one embodiment, each of the power supply ports 122, 124, and 126 may include a power controller 129 operatively coupled to the controller 114. The power controllers 129 may be employed to control voltage and/or current being supplied to the respective EOMs under the control of the controller 114. In another embodiment, there may be a common power controller (not shown) operatively coupled to the controller 114. The common power controller may be disposed in the network 102 or at a remote location from the network 102. Furthermore, the common power controller may be operatively coupled to the power supply ports 122, 124, and 126. The common power controller may be configured to selectively control the voltage and/or current being supplied to the EOMs 116, 118, and 120 under the control of the controller 114. The power controllers 129 or the common power controller may include electronics suitable for increasing or decreasing magnitude, frequency, and/or duty cycle of voltage and/or current being supplied by the respective power supply ports. Examples of the power controllers 129 or the common power controller may include, but are not limited to, digitally controlled resistors such as digital potentiometers or variable resistors, voltage regulators, elements (e.g., a Programmable Logic Controller (PLC)) of a Supervisory Control and Data Acquisition (SCADA) based system, and the like.

Moreover, each of the power supply ports 122, 124, and 126 may include a sensor 128 operatively coupled to the controller 114. The sensors 128 may be configured to detect electricity (e.g., current and/or voltage) being drawn by the respective EOM. In an alternative embodiment, a sensor (not shown) similar to the sensor 128 instead or additionally may be disposed at the transformer 112 or on the power supply lines 106. In such a configuration, the sensor may be configured to detect the electricity being drawn by the EOMs 116, 118, and 120 in the network 102. Furthermore, each of the sensors 128 may generate a signal indicative of the electricity being drawn by the respective EOM from the corresponding power supply port. The sensors 128 may include one or more of current transformers, Rogowski coils, resistors, fiber optic current sensors, Hall Effect integrated circuit sensors, sensors capable of detecting voltage, or combinations thereof. The sensors 128 may also include necessary electronics for communicating the information indicative of the sensed signal to the controller 114.

In certain embodiments, the sensors 128 and the power controllers 129 that are disposed in the power supply ports 122, 124, and 126 may be operatively coupled to the controller 114 via a communication link 134. In another embodiment, sensors (not shown) which are disposed at the transformer 112 or on the power supply lines 106 may be operatively coupled to the controller 114 via a communication link 136. The communication links 134 and 136 may be representative of a wired or a wireless medium of communication. In one embodiment, the controller 114, sensors 128, and/or power controllers 129 may constitute the system for determining the identity information corresponding to one or more of the EOMs 116, 118, and 120.

Furthermore, in some embodiments, electricity is fed to the power supply ports 122, 124, and 126 via the power supply lines 106. The power supply lines 106 may be coupled to the electricity source 108 through a link 130. In certain embodiments, the transformer 112 may be employed to couple the electricity from the electricity source 108 to the power supply lines 106. The electricity source 108 may represent a traditional grid or alternative sources of electricity such as a solar power plant, a wind based power plant, a hydro power plant, local power generators, and the like.

In one embodiment, the controller 114 may be disposed at a location remote from the network 102. In another embodiment, the controller 114 may be disposed within the network 102. The controller 114 may include a specially programmed general purpose computer, a microprocessor, a digital signal processor, and/or a microcontroller. The controller 114 may also include input/output ports and a storage medium, such as, an electronic memory. Various examples of the microprocessor include, but are not limited to, a reduced instruction set computing (RISC) architecture type microprocessor or a complex instruction set computing (CISC) architecture type microprocessor. Further, the microprocessor may be of a single-core type or multi-core type. Moreover, in some embodiments, the controller 114 may implement one or more operations of SCADA. The storage medium may store computer readable instructions that are executable by the general purpose computer, microprocessor, digital signal processor, and/or microcontroller for performing the methods described below as well as other variants that are anticipated but not specifically listed. In certain embodiments, the controller 114 may be capable of communicating with an external database (not shown).

The controller 114 may be configured to determine the identity information corresponding to one or more of the EOMs 116, 118, and 120 based on one or more electrical characteristics of the signal sensed by the corresponding one of sensors 128. The identity information of the EOMs 116, 118, and 120 may include, for example, the EOM make, the EOM model, the year of manufacturing, the vehicle number, information associated with the corresponding energy storage device, information associated with the owner or driver of the EOM, or combinations thereof. The electrical characteristics of the signal may include current and/or voltage characteristics, a power drawn versus time profile, harmonics, a total harmonic distortion, or combinations thereof.

In some embodiments, during a learning phase, the controller 114 may develop a knowledge base 115 indicative of a relationship between the identity information corresponding to multiple EOMs and the one or more electrical characteristics of the signal sensed by respective sensors to which the EOMs are electrically coupled to. Whereas, in some embodiments, the knowledge base 115 may be readily available for access by the controller 214. For example, the knowledge base 115 may be created in advance by a third party, available from an organization's database or from the Internet. In one embodiment, the knowledge base 115 may include one or more of a look-up table, a mathematical model, or a function. The knowledge base 115 may be stored in a memory device accessible by the controller 114. For example, the knowledge base 115 may be located in cloud storage. Alternatively, knowledge base 115 may be stored in a memory within the controller 114. The learning phase will be described in detail in conjunction with FIG. 2.

In order to determine the identity information of a particular EOM, for example the EOM 116, the controller 114 is configured to process the signal generated by the respective sensor 128 to determine the one or more electrical characteristics of the signal. More particularly, the controller 114 may perform a time domain analysis and/or a frequency domain analysis (e.g., Fourier analysis) of the signal generated by the respective sensor 128. Thereafter, the controller 114 may determine the identity information corresponding to the EOM 116 based on the knowledge base 115 developed by the controller 114. Details of identification of the EOMs will be described in detail in conjunction with FIG. 2.

Moreover, in certain embodiments, the controller 114 may selectively adjust a delivery of the electricity to one or more of the EOMs 116, 118, and 120 based on at least one of the identity information corresponding to the EOMs 116, 118, and 120, the current and/or voltage characteristics, the power drawn versus time profile, the harmonics, the total harmonic distortion, and combinations thereof, of the signals sensed by the sensors 128. In one embodiment, the selective adjustment may include prioritizing or deprioritizing the delivery of the electricity to one or more of the EOMs 116, 118, and 120. In another embodiment, the selective adjustment includes modifying at least one of a voltage and a current supplied to one or more of the EOMs 116, 118, and 120.

Moreover, in some embodiments, the system for determining the identity information corresponding to one or more of the EOMs 116, 118, and 120 also aids in health monitoring of the EOMs 116, 118, and 120. To aid in the health monitoring, the controller 114 may be configured to identify anomalous EOM(s) having abnormalities including, but not limited to, faulty components or presence of increased harmonics. By way of an example, the controller 114 may determine that a particular EOM is anomalous if the number of harmonics present in the current drawn by the EOM is greater than a first predefined limit. In another example, the controller 114 may determine that a particular EOM is anomalous if the total harmonic distortion in the current drawn by the EOM is greater than a second predefined limit. In one embodiment, the controller 114 may be configured to communicate a notification that is indicative of such anomaly. The notification may be communicated to an operator of the system, an operator of the anomalous EOM, and/or the owner of the anomalous EOM. Also, in one embodiment, the controller 114 may update the knowledge base 115 based on the detection of the anomaly.

Figure 2:
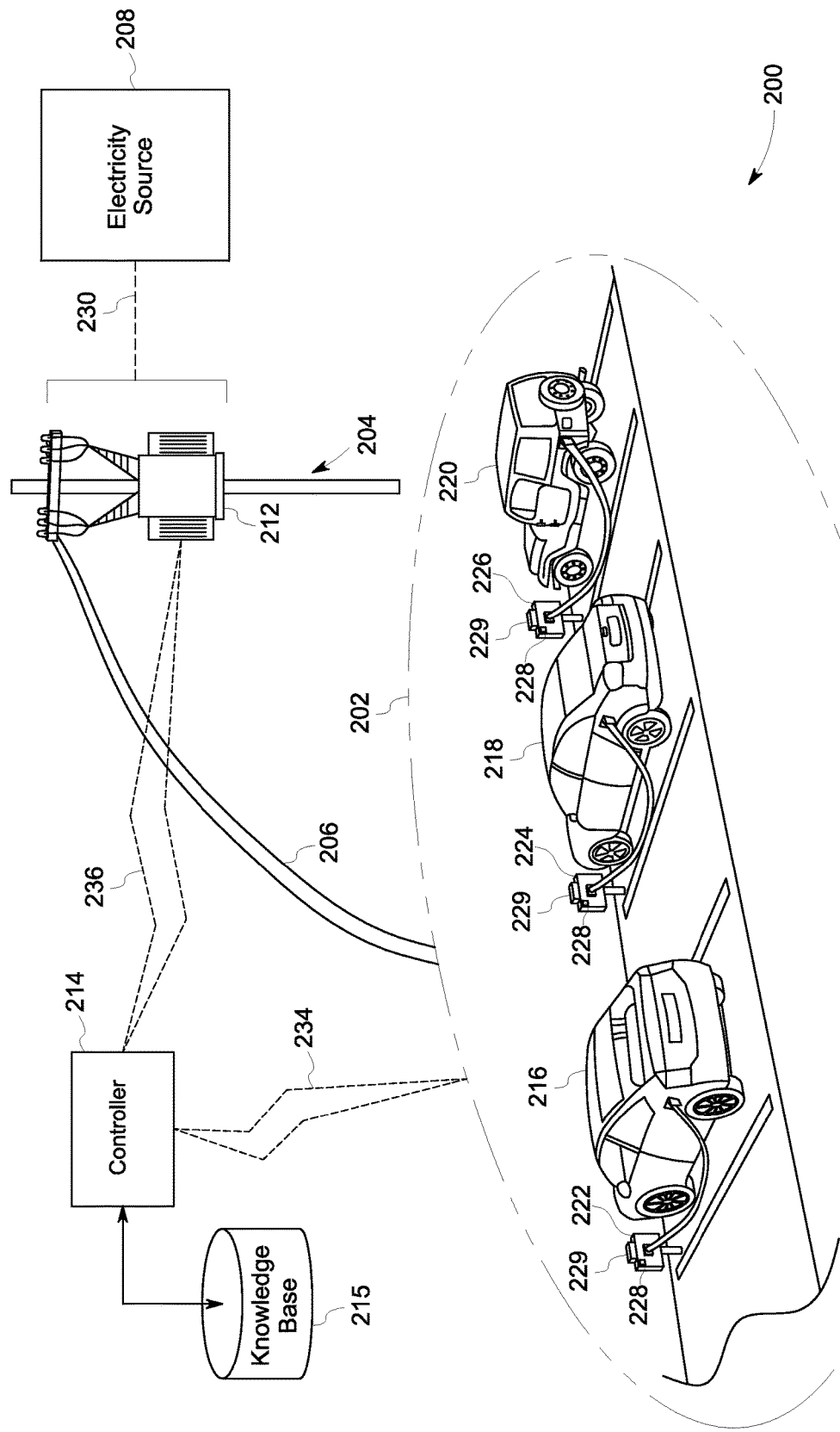
FIG. 2 is a diagrammatical illustration of an infrastructure in which a system for controlling charging of a vehicle may be employed, in accordance with one embodiment.

FIG. 2 is a diagrammatical illustration of an infrastructure 200 in which a system for controlling charging of vehicles may be employed, in accordance with one embodiment. The infrastructure 200 may include a charging facility 202, a pole 204 that supports power supply lines 206 coupled to an electricity source 208, a transformer 212 mounted on the pole 204, and a controller 214. The charging facility 202 facilitates charging of a plurality of vehicles, such as the vehicles 216, 218, and 220, via power supply ports 222, 224, and 226 (hereinafter also referred to as Electric Vehicle Supply Equipments (EVSEs) 222, 224, and 226), respectively. In one embodiment, as depicted in FIG. 2, the vehicles 216, 218, and 220 may be coupled to the EVSEs 222, 224, and 226 via a wired medium. In some embodiments, EVSEs 222, 224, and 226 are capable of wirelessly transferring electricity to the respective vehicles 216, 218, and 220.

The vehicles 216, 218, and 220 may include vehicles that are operable at least partially by electricity, such as, electric vehicles and hybrid electric vehicles. Each of the vehicles 216, 218, and 220 may include one or more energy storage devices such as batteries and/or capacitors to store at least a portion of the electricity received from the respective EVSEs 222, 224, and 226. The vehicles 216, 218, and 220 may be represented by their respective identity information that may include a machine make, a machine model, a year of manufacturing, a vehicle number, information associated with the respective energy storage devices, information associated with an owner or a driver of the vehicles, or combinations thereof. By way of example, the information associated with the respective energy storage devices may include model number, energy storage capacity, etc. Similarly, the information associated with the owner or driver of the vehicles may include name, address, designation or rank, preferences, special recommendations, etc. For the sake of brevity, certain description of various elements of the infrastructure 200 that are similar to the elements of infrastructure 100 is not repeated.

In one embodiment, each of the EVSEs 222, 224, and 226 may further include a power controller 229 to control voltage and/or current being supplied to the respective vehicles 216, 218, and 220 under the control of the controller 214. In another embodiment, there may be a common power controller (not shown). The common power controller may be disposed in the charging facility 202 or at a remote location from the charging facility 202. Furthermore, the common power controller may be operatively coupled to the EVSEs 222, 224, and 226. Moreover, the common power controller may be employed to selectively control the voltage and/or current being supplied to one or more of the vehicles 216, 218, and 220 under the control of the controller 214. Examples of the power controllers 229 or the common power controller may include, but are not limited to, digitally controlled resistors such as digital potentiometers or variable resistors, voltage regulators, elements (e.g., a PLC) of the SCADA based system, and the like.

Each of the EVSEs 222, 224, and 226 may further include a sensor 228 operatively coupled to the controller 214. Alternatively, a sensor such as the sensor 228 instead or additionally may be disposed at the transformer 212 or on the power supply lines 206. The sensors 228 may generate a signal indicative of electricity being drawn by the respective vehicle.

The controller 214 may be operatively coupled to the sensors 228 and the power controllers 229 via a communication link 234. Alternatively, when a sensor (such as the sensor 228) is disposed either at the transformer 212 or on the power supply lines 206, the controller 214 may be operatively coupled to the sensors via a communication link 236. The controller 214, sensors 228, and power controllers 229 may constitute the system for controlling charging of the vehicles 216, 218, and 220.

In some embodiments, the controller 214 may be trained during a learning phase to develop a knowledge base 215 that may include look-up tables, mathematical models, and/or functions indicative of a relationship between the identity information corresponding to vehicles in a fleet and corresponding to one or more electrical characteristics of the signals sensed by respective sensors. More particularly, in certain embodiments, the knowledge base 215 may be developed based on a large set of vehicles such as a fleet of vehicles containing, for example, a variety of vehicle makes, models, and years of manufacture. Moreover, the identity information related to the vehicles in the fleet of vehicles may be provided to the controller 214. Subsequently, the controller 214 may process the signals sensed by respective sensors 228 to determine various electric characteristics for the vehicles including, but not limited to, the current and/or voltage characteristics, the power drawn versus time profile, the harmonics, or the total harmonic distortion, and combinations thereof.

Figure 3:
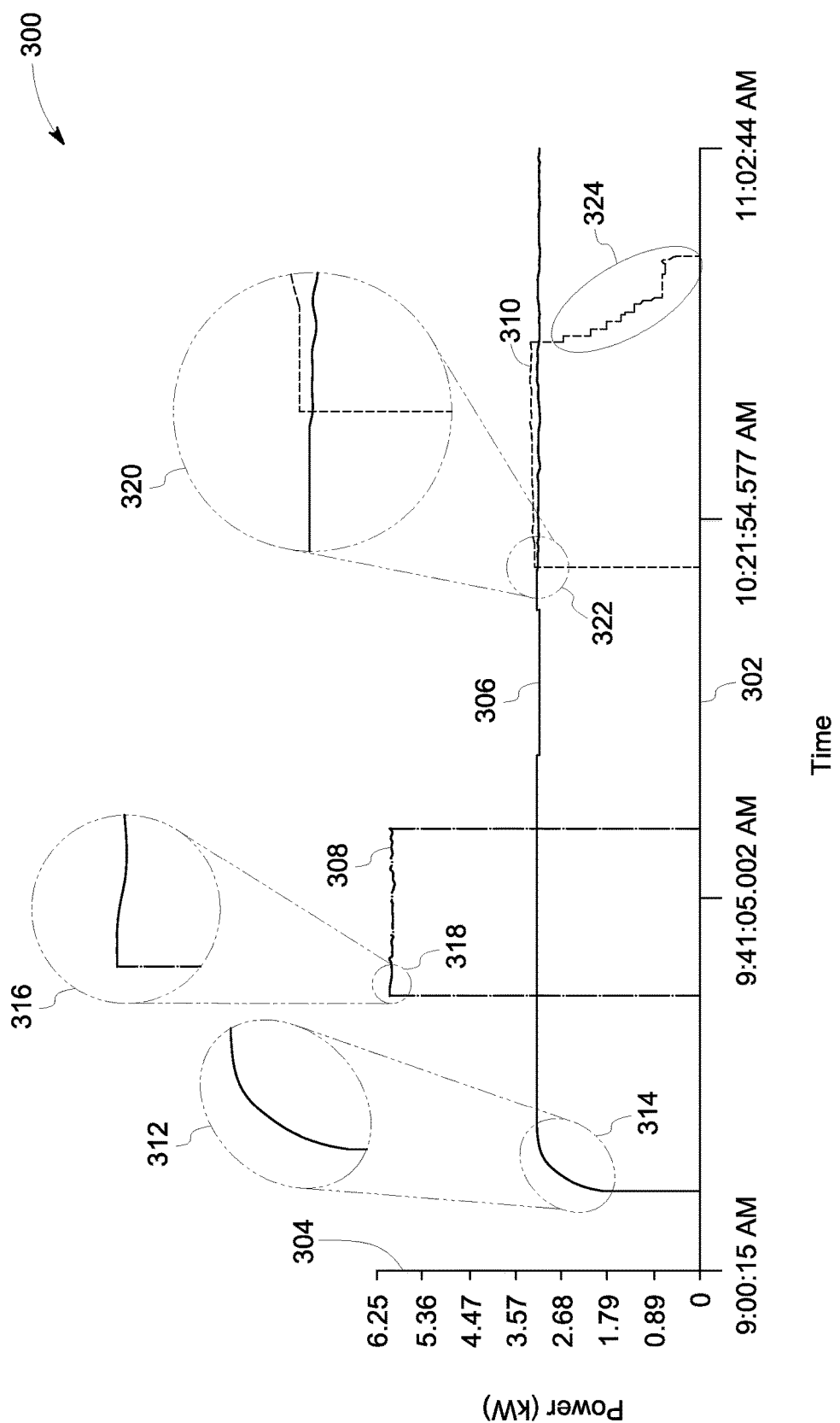
FIG. 3 depicts a graphical representation showing an electrical characteristic such as a power drawn versus time profile, in accordance with one embodiment.

FIG. 3 depicts a graphical representation 300 of an electrical characteristic, such as the power drawn, versus time profile for three vehicles—vehicle-A, vehicle-B, and vehicle-C, in accordance with one embodiment. The X-axis 302 of the graphical representation 300 represents time and the Y-axis 304 represents power in kilowatts (kW). The graphical representation 300 includes curves 306, 308, and 310 representative of power being drawn over time by the vehicle-A, vehicle-B, and vehicle-C, respectively. As depicted, the power drawn 306 by the vehicle-A has a smooth profile that is indicative of a smooth charging. That is once the vehicle-A is electrically coupled to the respective EVSE, the power being drawn by vehicle-A gradually/slowly increases towards a steady state level, for example, at about 3.4 kW, as depicted in an enlarged view 312 of a region 314. The power drawn 308 by the vehicle-B is much higher in amplitude, for example, at about 6.25 kW, which is indicative of higher power requirement for charging the vehicle-B as compared to the vehicles-A and C. Additionally, the power drawn by the vehicle-B indicates a sharp start as observed in an enlarged view 316 of a region 318 in comparison to the gradual increase in the power drawn 306 depicted in the enlarged view 312. Also, the power drawn 310 by the vehicle-C indicates a sharp start as depicted in an enlarged view 320 of a region 322, however, overall charging profile of the vehicle is very noisy as depicted in the region 324. More particularly, before completion of the charging (e.g., before reaching to a power level of zero kW), the power drawn by the vehicle-C decreases in a manner as depicted in the region 324.

Figure 4:
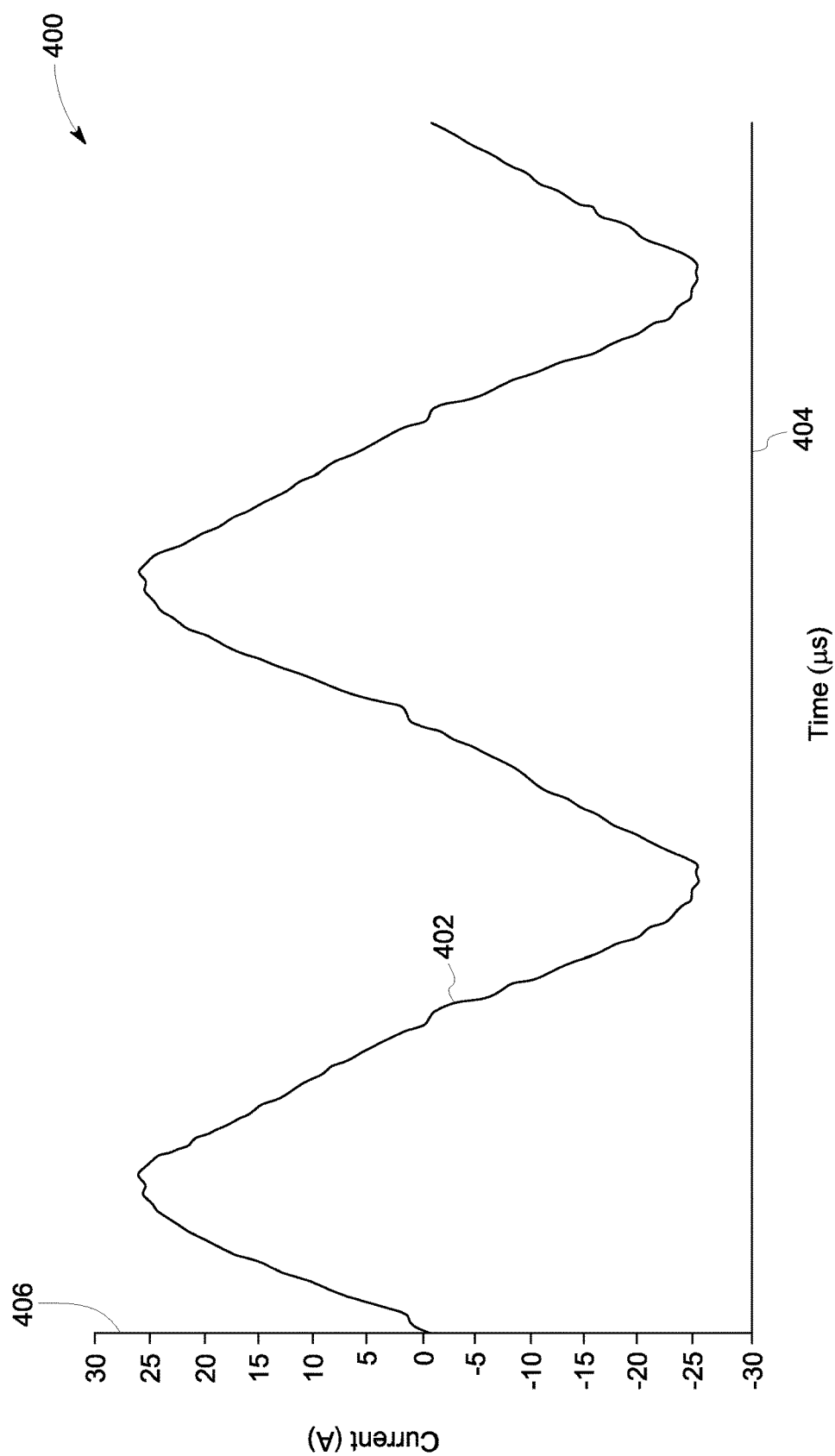
FIG. 4 depicts a graphical representation showing another electric characteristic such as a current being drawn by a vehicle.
Figure 5:
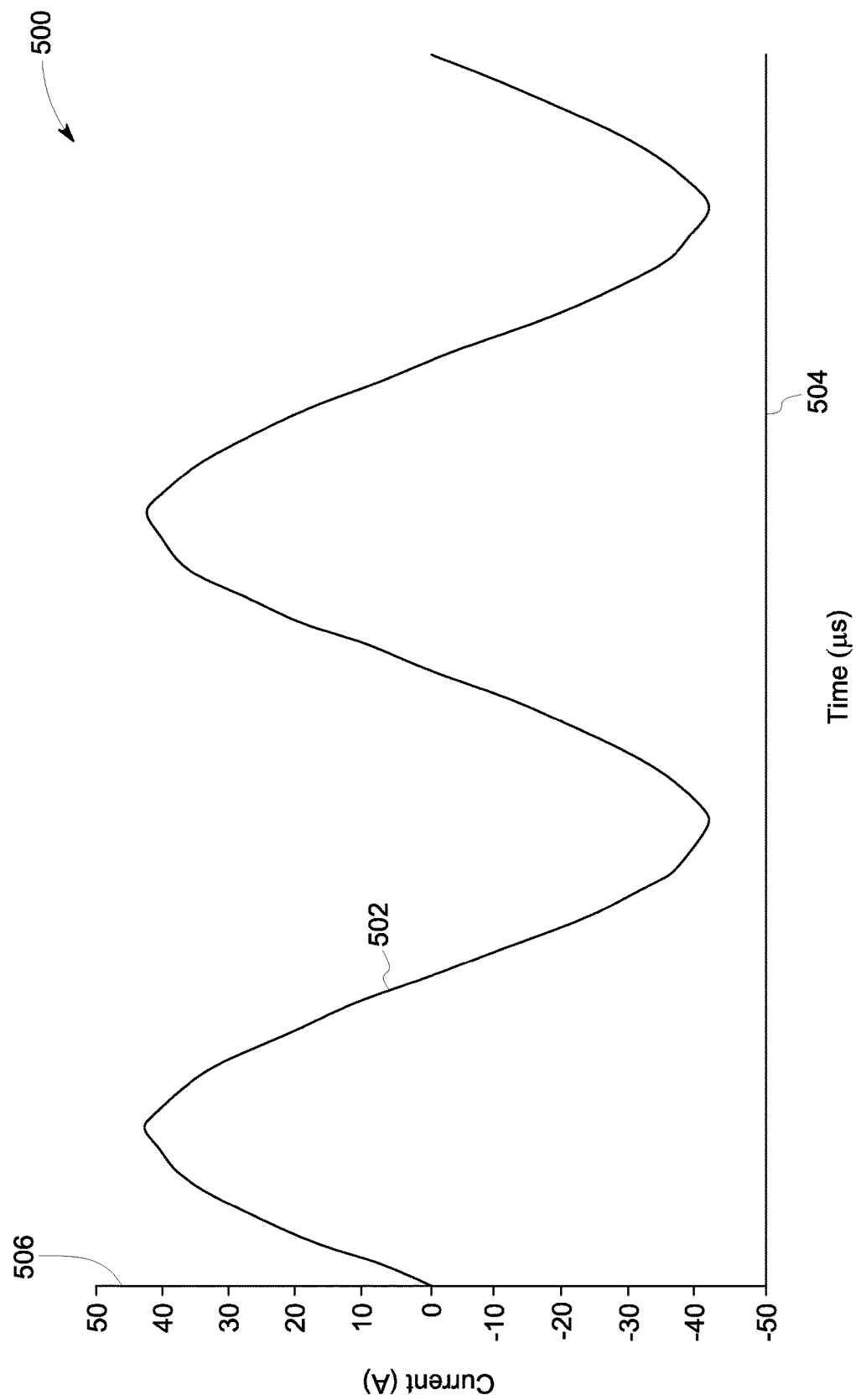
FIG. 5 depicts a graphical representation showing an electric characteristic such as a current being drawn by another vehicle.

Moreover, FIG. 4 depicts a graphical representation 400 showing another electric characteristic in the form of current 402 being drawn by a fourth vehicle-D. The X-axis 404 of the graphical representation 400 represents time and the Y-axis 406 represents current in Amperes (A). Similarly, FIG. 5 depicts a graphical representation 500 showing the electric characteristic in the form of current 502 being drawn by a fifth vehicle-E. As with the plot of FIG. 4, the X-axis 504 represents time and the Y-axis 506 represents current in Ampere (A). It may be observed that the current 402 being drawn by the vehicle-D is much noisier in comparison to the current 502 being drawn by the vehicle-E. This indicates that the current 402 contains more harmonic content in comparison to the current 502. Therefore, the total harmonic distortion in the current 402 is greater than the total harmonic distortion in the current 502.

Referring again to FIG. 2, the controller 214 may analyze the determined electric characteristics (including but not limited to the electric characteristics depicted in FIGS. 3-5) to establish the knowledge base 215 indicative of the identity of the vehicles A-E and the electric characteristics of the signal sensed by respective sensors. In some embodiments, the knowledge base 215 may be readily available. For example, the knowledge base 215 may be created in advance by a third party, available from an organization's database or from the Internet. In any event, once the knowledge base 215 is established, the controller 214 may analyze the determined electric characteristics and, using one or more of the determined electric characteristics, cross-reference the knowledge base 215 to determine identity information of the vehicles.

FIG. 6 depicts an example knowledge base (such as the knowledge base 215), in accordance with one embodiment. In the example of FIG. 6, the knowledge base is depicted as a look-up table 600 developed by the controller 214 based on the charging of the vehicles A-E. The look-up table 600 represents values of certain parameters, such as, vehicle ID, make/manufacturer, model number, machine number, maximum power drawn, energy storage capacity (Ampere-hour), total harmonic distortion, harmonics present, name of owner or driver corresponding to the vehicles A-E. In non-vehicle applications, the parameters may be tailored as appropriate.

For the sake of brevity, only certain parameters have been listed in the knowledge base of FIG. 6. Various other parameters such as the year of manufacturing, vehicle number (e.g., license plate number), model number of the energy storage device, additional information associated with respective owners or drivers such as address, designation or rank, preferences, special recommendations, . . . etc., may also be present in the knowledge base without limiting the scope of the present specification. Moreover, although the look-up table 600 is represented by a single table, the look-up table 600 may be stored in the form of multiple interlinked tables, for example, in the form of a relational database. Furthermore, the values depicted in the look-up table 600 are used for the purpose of illustration only.

Referring again to FIG. 2, during the operation of the system, in a given period of time, the three vehicles 216, 218, and 220 are charged in the charging facility 202. While the vehicles 216, 218, and 220 are being charged, the sensors 228 may generate respective signals that are indicative of the electricity being drawn by the vehicles 216, 218, and 220 from the respective EVSEs 222, 224, and 226. The controller 214 may receive the signals generated by sensors 128 over the communication links 234 or 236, as applicable.

Thereafter, the controller 214 may process the received signals to determine one or more electrical characteristics such as the current and/or voltage characteristics, power drawn versus time profile, harmonics, total harmonic distortion, or combinations thereof, corresponding to the signals. Moreover, the controller 214 may be configured to determine the identity of one or more of the vehicles 216, 218, and 220 based on the respective electrical characteristics of the signals and the developed knowledge base 215. For example, the controller 214 may determine the machine make, machine model, year of manufacturing, vehicle number, information associated with the respective energy storage devices, information associated with an owner or a driver of the vehicles, or combinations thereof. Additionally, the controller 214 may also determine a present state of charge, an energy storage capacity, and/or remaining power required for charging the energy storage device for one or more of the vehicles 216, 218, and 220 based on the respective determined identity information.

The controller 214 may further be configured to selectively control charging of one or more of the vehicles 216, 218, and 220 depending on the determined identity information and respective electrical characteristics of the signals. In one embodiment, in order to selectively control the charging of one or more of the vehicles 216, 218, and 220, the controller 214 may be configured to modify voltage and/or current levels supplied to the one or more of the vehicles 216, 218, and 220 based on at least one of the respective identity information, the one or more electrical characteristics of the signal, the energy storage capacity, and the remaining power required for charging the energy storage device corresponding to the vehicle and other vehicles being charged from respective EVSEs. In some embodiments, in order to modify the voltage and/or current levels, the respective power controller 229 may be operated under the control of the controller 214.

In another embodiment, in order to selectively control the charging of one or more of the vehicles 216, 218, and 220, the controller 214 may be configured to prioritize or deprioritize a delivery of the electricity to the one or more of the vehicles 216, 218, and 220 based on at least one of the respective identity information, the one or more electrical characteristics of the signal, the energy storage capacity, and the remaining power required for charging the energy storage device corresponding to the vehicle and other vehicles being charged from respective EVSEs. In some embodiments, the controller 214 may determine the priority among the vehicles 216, 218, and 220 based on parameters including, but not limited to, the name, address, designation or rank, preferences, and/or special recommendations corresponding to the owners or drivers of the vehicles 216, 218, and 220, the energy storage capacity and/or the remaining power required to fully charge the respective energy storage devices, the harmonics and/or the total harmonic distortion in the respective charging currents. In some embodiments, harmonic content in the current may adversely impact the performance of the transformer 212. Therefore, in such instances, the vehicles whose charging current includes harmonic content and/or the total harmonic distortion greater than a specified limit may be given a lowest priority for charging. Similarly, the vehicles that require higher power to fully be charged may be given a lower priority in comparison to vehicle that requires lower power to be fully charged.

In certain embodiments, during the operation of the system, the knowledge base 215 that was established during the learning phase may be dynamically updated. For example, when a new vehicle is identified by the controller 214, the controller 214 may be configured to update the knowledge base 215. The controller 214 may determine that the identified vehicle is a new vehicle if the electrical characteristics of a signal sensed by the respective sensor 228 do not find any match in the existing knowledge base 215. In some embodiments, if it is determined that the vehicle is new in the fleet, the controller 214 may assign a default priority to the newly detected vehicle. In one embodiment, the default priority may be the highest priority. In an alternative embodiment, the default priority may be the lowest priority. In some embodiment, if it is determined that the vehicle is new in the fleet, the controller 214 may obtain relevant identity information from an external database such as a company's master database where information about employees is stored. Moreover, the priority of the vehicle may be determined based on the identity information obtained from the external database. The controller 214 may then update the knowledge base 215.

Moreover, in some embodiments, the system for controlling the charging of the vehicles also aids in health monitoring of the vehicles 216, 218, and 220. To aid in the health monitoring, the controller 214 may be configured to identify anomalous vehicle(s) having degraded or faulty components. By way of an example, the controller 214 may determine that a particular vehicle is anomalous if, at a fully charged condition, the energy stored in the respective energy storage device is less than its energy storage capacity. In one embodiment, the controller 214 may be configured to communicate a notification that is indicative of such anomaly. The notification may be communicated to an operator of the system and/or the respective owner/driver of the anomalous vehicle. Also, in one embodiment, the controller 214 may update the knowledge base 215 based on such a change in the energy storage capacity for the respective vehicle.

Figure 7:
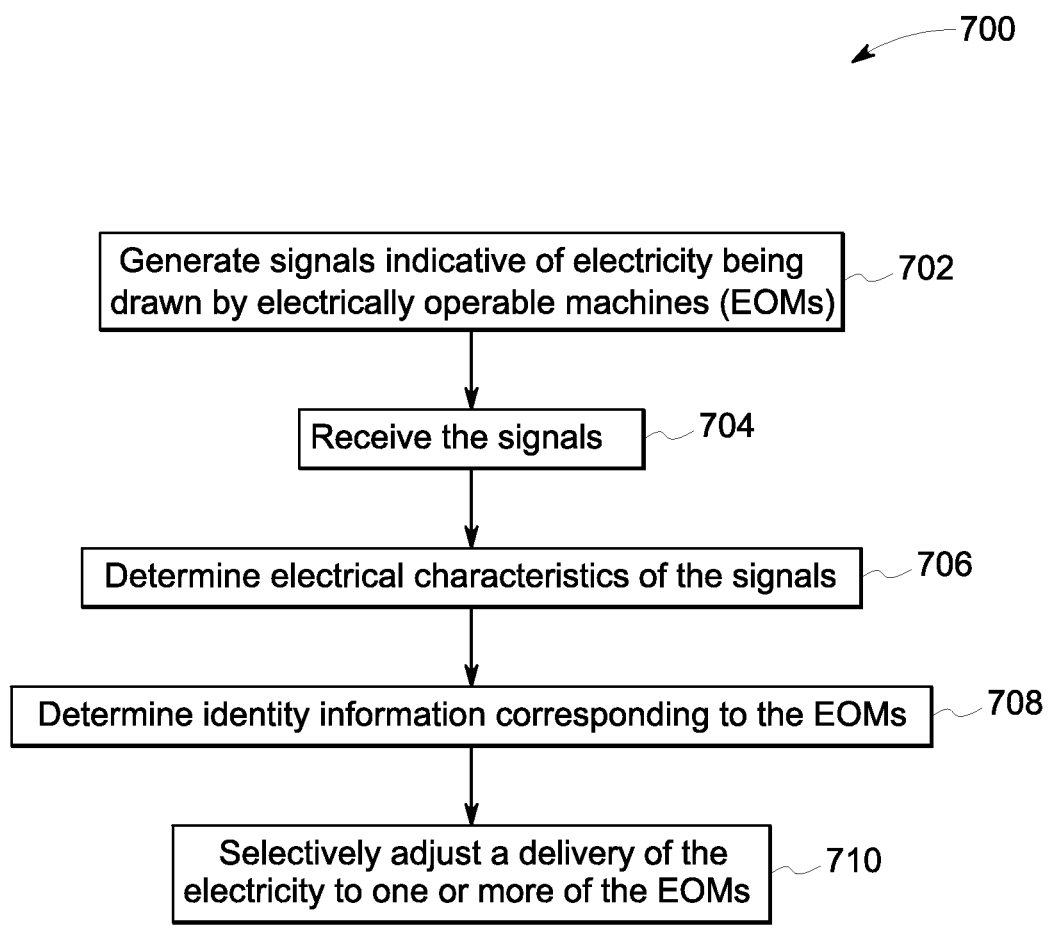
FIG. 7 depicts a flow chart illustrating an example method for determining identity information corresponding to an EOM, in accordance with one embodiment.

FIG. 7 depicts a flow chart 700 illustrating an example method for determining identity information corresponding to an EOM, in accordance with one embodiment. The flow chart 700 of FIG. 7 is described in conjunction with the elements of FIGS. 1 and 2. As previously noted, a controller such as the controller 114 or the controller 214 may develop a knowledge base (115 or 215) during a learning phase based on a fleet of vehicles. During an operation of the controller, a plurality of EOMs (such as the EOMs 116, 118, and 120 or vehicles 216, 218, and 220) may be connected in a network (such as the network 102 or the charging facility 202) for receiving electricity.

While the EOMs receives the electricity from respective power supply ports (such as the power supply ports 122, 124, and 126 or the EVSEs 222, 224, and 226), a signal indicative of electricity being drawn by the EOMs may be generated by respective sensors (such as the sensors 118 or 228), as indicated by step 702. In one embodiment, to aid in the identification of the respective EOMs, the sensors may start generating the signals as soon as the respective EOMs are coupled to the corresponding power supply ports.

At step 704, the signals generated by the sensors may be received by the controller. Subsequently, one or more electrical characteristics of the signals sensed by the sensors may be determined by the controller, as indicated by step 706. In order to determine the electrical characteristics, the controller may process the signal by applying various time domain and/or frequency domain signal processing techniques. At step 708, the identity information corresponding to one or more of the EOMs may be determined by the controller. In one embodiment, the identity information may be determined based on the determined electrical characteristics and the knowledge base, as described in FIGS. 1 and 2.

Moreover, at step 710, a delivery of the electricity to one or more of the EOMs may be selectively adjusted. In the embodiment of FIG. 2, the selectively adjusting the delivery of the electricity may constitute controlling charging of the vehicles (e.g., EOMs). As previously noted, in one embodiment, selectively adjusting the delivery of the electricity may include prioritizing or deprioritizing of the delivery of the electricity. In another embodiment, selectively adjusting the delivery of the electricity may include modifying the current and/or voltage being supplied to one or more of the EOMs.

Any of the foregoing steps and/or system elements may be suitably replaced, reordered, or removed, and additional steps and/or system elements may be inserted, depending on the needs of a particular application, and that the systems of the foregoing embodiments may be implemented using a wide variety of suitable processes and system elements and are not limited to any particular computer hardware, software, middleware, firmware, microcode, and the like.

The systems and method for determining identity information of EOMs described hereinabove aids in better management and effective utilization of the EOMs. Moreover, since the identity information is determined based on the characteristics of the power drawn by the respective EOMs, additional infrastructural elements such as markers, RFID tags, and corresponding scanning and/or detection systems may be avoided, thereby leading to a cost effective solution. Moreover, charging of the vehicles may be controlled in accordance with various embodiments. Such a controlled charging of the vehicles may lead to effective utilization of the electricity and faster charging in certain cases. Additionally, in certain instances, the transformers may be protected from excessive stresses caused due to noisier charging/power consumption.

Furthermore, the foregoing examples, demonstrations, and method steps such as those that may be performed by the system may be implemented by suitable code on a processor-based system, such as a general-purpose or special-purpose computer. Different implementations of the systems and methods may perform some or all of the steps described herein in different orders, parallel, or substantially concurrently. Furthermore, the functions may be implemented in a variety of programming languages, including but not limited to C++ or Java. Such code may be stored or adapted for storage on one or more tangible, computer readable media, such as on data repository chips, local or remote hard disks, optical disks (that is, CDs or DVDs), memory or other media, which may be accessed by a processor-based system to execute the stored code.

It will be appreciated that variants of the above disclosed and other features and functions, or alternatives thereof, may be combined to create many other different systems or applications. Various unanticipated alternatives, modifications, variations, or improvements therein may be subsequently made by those skilled in the art and are also intended to be encompassed by the following claims.

The invention claimed is:

1. A system for controlling charging of an electrically operable machine, the system comprising:

a power supply port coupled to an electricity source to receive electricity via a transformer and power supply lines, wherein the power supply port comprises:
at least one sensor configured to generate a signal indicative of the electricity being drawn by the electrically operable machine of a plurality of electrically operable machines connected in a network, wherein the electrically operable machine is coupled to the power supply port to receive the electricity;
a power controller configured to control supply of the electricity to the electrically operable machine;
a controller coupled to the at least one sensor and configured to:
determine one or more electrical characteristics of the signal generated by the at least one sensor by processing the signal, wherein the one or more electrical characteristics comprise a power drawn versus time profile, harmonics, a total harmonic distortion, or combinations thereof;
determine identity information corresponding to the electrically operable machine based on the one or more electrical characteristics of the signal generated by the at least one sensor; and
selectively adjust the charging of the electrically operable machine based at least on the identity information corresponding to the electrically operable machine and remaining power required for charging other electrically operable machines of the plurality of electrically operable machines,
wherein the power controller is operatively coupled to the controller and configured to control voltage, current, or both the voltage and the current being supplied to the electrically operable machine under the control of the controller.

2. The system of claim 1, wherein the electrically operable machine comprises at least one of an electric vehicle, a hybrid electric vehicle, a household electric equipment, or an industrial equipment.

3. The system of claim 1, wherein the identity information comprises a machine make, a machine model, a year of manufacturing, a vehicle number, information associated with a corresponding energy storage device, information associated with an owner or driver of the electrically operable machine, or combinations thereof.

4. The system of claim 1, wherein the at least one sensor comprises a current sensor, a voltage sensor, or a combination thereof.

5. The system of claim 1, further comprising a knowledge base indicative of a relationship between the identity information corresponding to the electrically operable machine and the one or more electrical characteristics of the signal, wherein the knowledge base is available from one or more external sources or developed by the controller, and wherein the knowledge base comprises at least one of a look-up table, a mathematical model, or a function.

6. The system of claim 5, wherein the controller is further configured to update the knowledge base during the operation of the system.

7. The system of claim 5, wherein the controller is configured to determine the identity information corresponding to the electrically operable machine based at least on the knowledge base.

8. The system of claim 1, wherein the controller is further configured to notify at least one of an operator of the system, an operator of the electrically operable machine, or an owner of the electrically operable machine if the electrically operable machine is anomalous.

9. A system for controlling charging of a vehicle operable at least partially by electricity, the system comprising:
- a power supply port coupled to an electricity source to receive electricity via a transformer and power supply lines, wherein the power supply port comprises:
  - at least one sensor configured to generate a signal indicative of the electricity being drawn by the vehicle of a plurality of vehicles connected in a charging facility from the power supply port, wherein the vehicle is coupled to the power supply port to receive the electricity;
- a power controller configured to control supply of the electricity to the vehicle; a controller communicatively coupled to the at least one sensor and configured to:
- determine one or more electrical characteristics of the signal generated by the at least one sensor by processing the signal, wherein the one or more electrical characteristics comprise a power drawn versus time profile, harmonics, a total harmonic distortion, or combinations thereof;
- determine identity information corresponding to the vehicle based on the one or more electrical characteristics of the signal generated by the at least one sensor; and
- selectively adjust the charging of the vehicle based at least on the identity information corresponding to the vehicle and remaining power required for charging other vehicles of the plurality of vehicles,
- wherein the power controller is operatively coupled to the controller and configured to control voltage, current, or both the voltage and the current being supplied to the vehicle under the control of the controller.

10. The system of claim 9, wherein the identity information comprises a machine make, a machine model, a year of manufacturing, a vehicle number, information associated with a corresponding energy storage device, information associated with an owner or driver of the vehicle, or combinations thereof.

11. The system of claim 9, wherein the controller is further configured to determine at least one of an energy storage capacity of an energy storage device corresponding to the identity information of the vehicle or remaining power required for charging the energy storage device.

12. The system of claim 11, wherein to selectively adjust the charging of the vehicle, the controller is configured to prioritize or deprioritize a delivery of the electricity to the vehicle based on at least one of the identity information, the one or more electrical characteristics of the signal, the energy storage capacity, or the remaining power required for charging the energy storage device corresponding to the vehicle and other vehicles being charged from respective power supply ports.

13. The system of claim 11, wherein to selectively adjust the charging of the vehicle, the controller is configured to modify the voltage, the current, or both the voltage and the current supplied to the vehicle based on at least one of the identity information, the one or more electrical characteristics of the signal, the energy storage capacity, or the remaining power required for charging the energy storage device corresponding to the vehicle and other vehicles being charged from respective power supply ports.

14. The system of claim 9, wherein the controller is configured to notify at least one of an operator, an owner of the vehicle, or a driver of the vehicle if the vehicle is anomalous.

* * * * *